United States Patent
Sehgal et al.

(10) Patent No.: US 10,019,332 B1
(45) Date of Patent: Jul. 10, 2018

(54) NON-VOLATILE MEMORY WITH PROGRAM FAILURE RECOVERY

(71) Applicant: Western Digital Technologies, Inc., Irvine, CA (US)

(72) Inventors: Rohit Sehgal, San Jose, CA (US); Nian Niles Yang, Mountain View, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/456,237

(22) Filed: Mar. 10, 2017

(51) Int. Cl.
*G11C 11/34* (2006.01)
*G06F 11/20* (2006.01)
*G11C 16/10* (2006.01)
*G11C 16/26* (2006.01)

(52) U.S. Cl.
CPC .......... *G06F 11/2094* (2013.01); *G11C 16/10* (2013.01); *G11C 16/26* (2013.01); *G06F 2201/85* (2013.01)

(58) Field of Classification Search
CPC . G06F 11/2094; G06F 2201/85; G11C 16/10; G11C 16/26
See application file for complete search history.

(56) References Cited

U.S. PATENT DOCUMENTS

| | | | |
|---|---|---|---|
| 7,405,976 B2 | 7/2008 | Hebishima | |
| 7,797,597 B2 | 9/2010 | Roohparvar | |
| 8,788,880 B1 | 7/2014 | Gosla | |
| 9,442,839 B1 | 9/2016 | Sharma | |
| 2004/0111583 A1* | 6/2004 | Han | G06F 12/0246 711/203 |
| 2007/0101096 A1 | 5/2007 | Gorobets | |
| 2008/0235540 A1* | 9/2008 | Kobayashi | G11C 29/44 714/719 |
| 2010/0106893 A1 | 4/2010 | Fasoli | |
| 2010/0142275 A1 | 6/2010 | Yogev | |
| 2014/0047168 A1 | 2/2014 | Kim | |
| 2014/0215122 A1* | 7/2014 | Li | G06F 11/1666 711/103 |

* cited by examiner

*Primary Examiner* — Mohammed A Bashar
(74) *Attorney, Agent, or Firm* — Vierra Magen Marcus LLP

(57) ABSTRACT

A non-volatile storage system is proposed with an efficient process for recovering from programming failures. In response to determining that a program fault occurred, and prior to completing the programming, the system programs data associated with the program fault to a back-up location. After programming the data associated with the program fault to the back-up location, the system continues programming including programming data that has not yet been subject of a programming process to the back-up location. After completing the programming process, the system moves already programmed data near the location of the program fault to the back-up location.

20 Claims, 21 Drawing Sheets

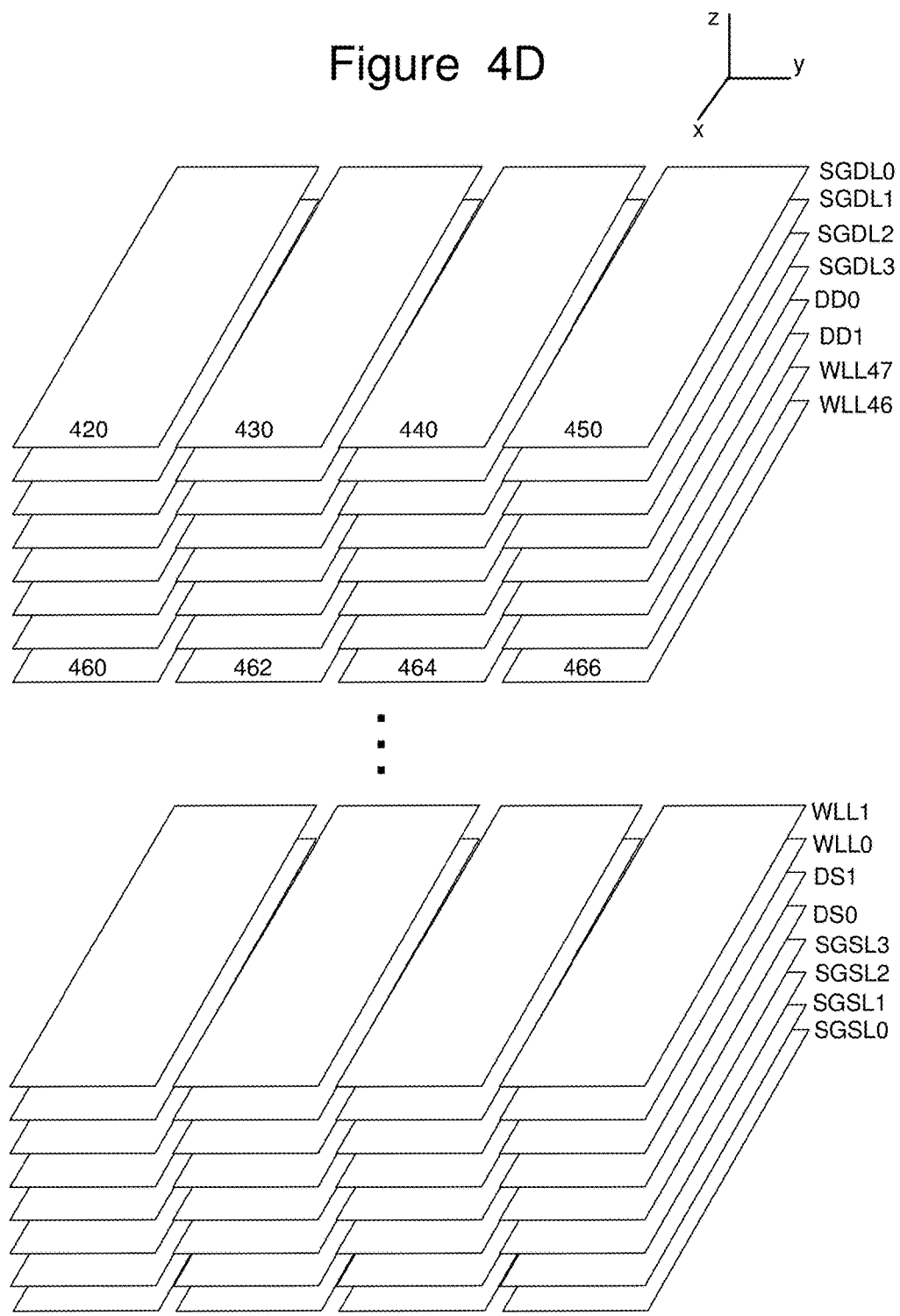

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

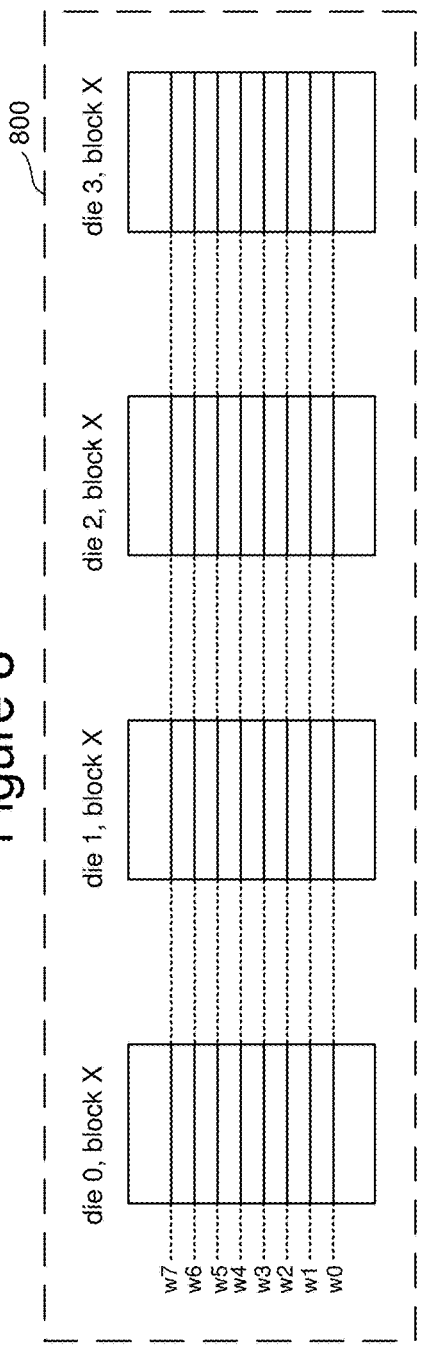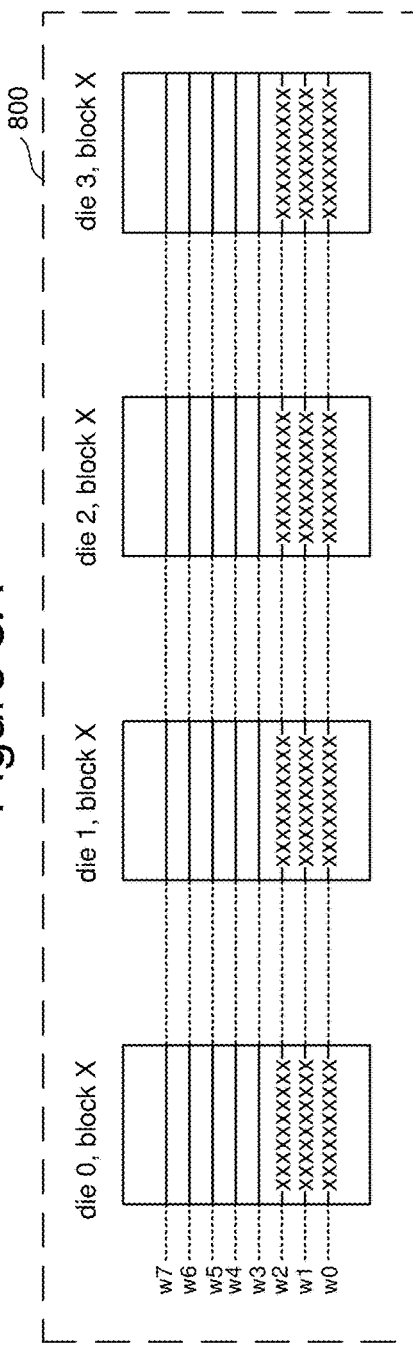

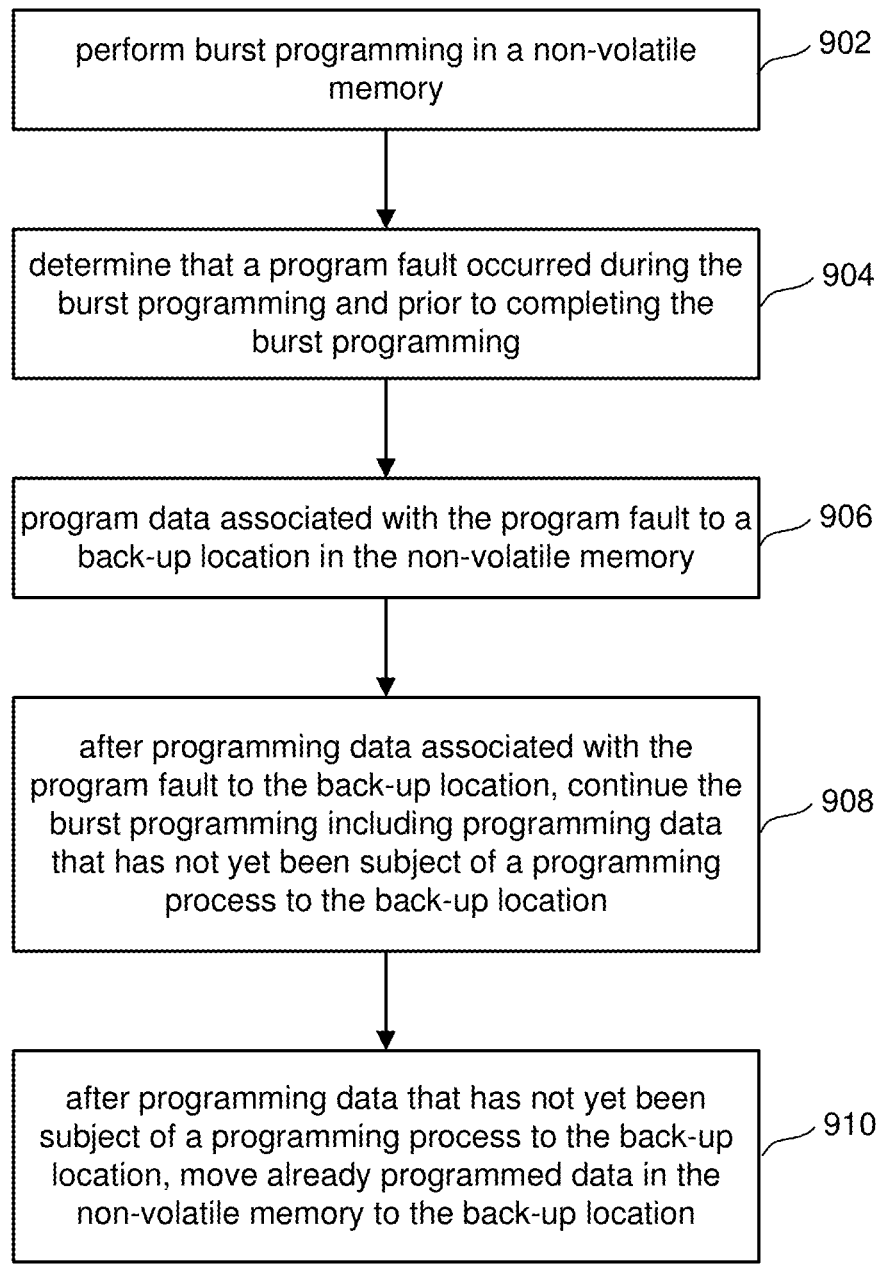

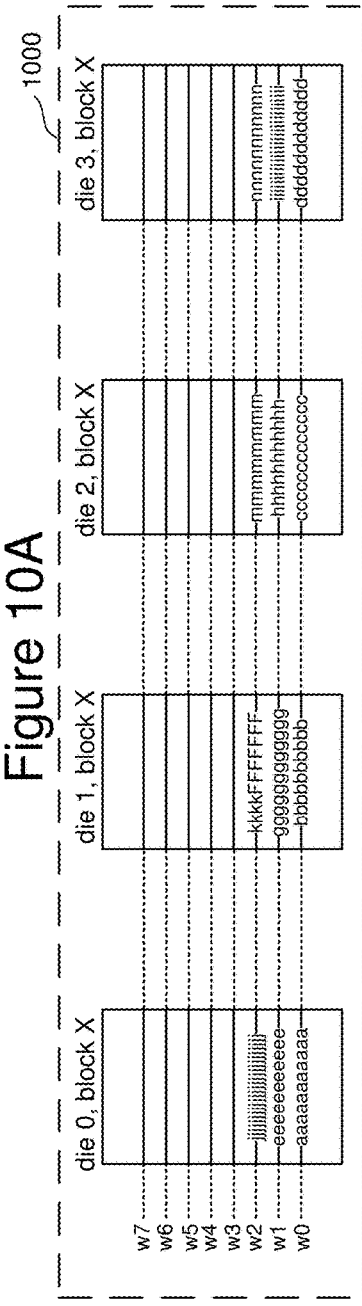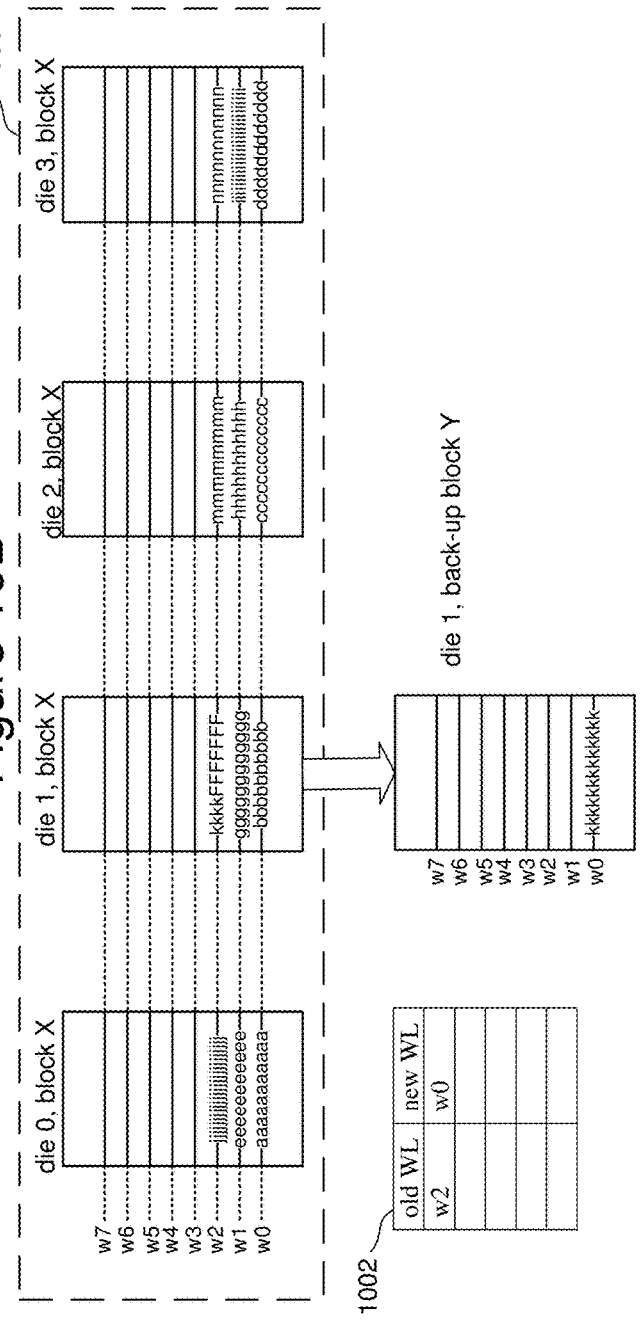

Figure 12

| Jumbo Block ID | Faulty Block | Faulty Word Line | Back-Up Block | First WL in Back-Up Block | WL for Start of Old Data |
|---|---|---|---|---|---|
| 100 | 145 | 10 | 1000 | 0 | 7 |
| 244 | 230 | 40 | 1001 | 0 | 2 |
| 301 | 440 | 32 | 1002 | 0 | 30 |
| ... | ... | ... | ... | ... | ... |

NON-VOLATILE MEMORY WITH PROGRAM FAILURE RECOVERY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. The data can then be read back and provided in response to read requests. It is important that data stored in a memory system is not lost. Performance of the memory system, such a speed of operation, is also important to hosts, clients, users, etc.

Semiconductor memory, like other electronics, are subject to manufacturing variations. Many defects can be found by tests performed during the manufacturing phase. However, some defects are latent such that they will not be identified by tests performed during the manufacturing phase because these latent defects do not initially change behavior of the device. Over time the defects may manifest themselves causing erroneous device behavior. Examples of such defects includes shorts between signal lines and broken components. These defects can lead to failure of a programming process. To protect against latent defects during the programming process, some memory devices include means for determining whether a programming process failed. When it is discovered that a programming process failed, some memory systems will pause the programming process, reprogram the data somewhere else and move nearby data (e.g., data in the same block) to a new location. Subsequently, the original programming process is continued. While this method does help with failures when programming, the pausing of the programming process slows down the operation of the memory system from the point of view of a host, client or user.

BRIEF DESCRIPTION OF THE DRAWINGS

Like-numbered elements refer to common components in the different figures.

FIG. 4D depicts a view of the select gate layers and word line layers.

FIG. 8 depicts a jumbo block.

FIG. 8A depicts a jumbo block storing data in response to burst programming.

FIG. 9 is a flow chart describing one embodiment of a process for efficiently recovering from a program failure.

FIGS. 10A-D depicts a jumbo block during the process of FIG. 9.

FIG. 12 is a block diagram of one example of a linking table.

DETAILED DESCRIPTION

A non-volatile storage system is proposed with an efficient process for recovering from programming failures. In response to determining that a program failure (also known as a program fault) occurred, and prior to completing the programming, the system programs data associated with the program fault to a back-up location. After programming the data associated with the program fault to the back-up location, the system continues programming including programming data that has not yet been subject of a programming process to the back-up location. After completing the programming process, the system moves already programmed data near the location of the program fault to the back-up location. By waiting to move the already programmed data until after completing the programming, a host (or client, user, etc.) will experience faster programming performance.

Figure 1:
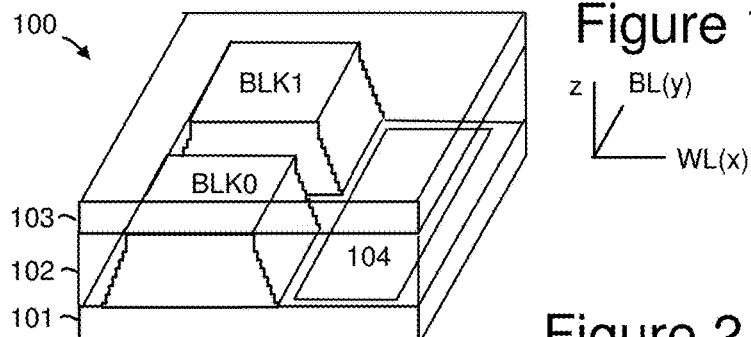
FIG. 1 is a perspective view of a 3D stacked non-volatile memory device.

FIGS. 1-4F describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
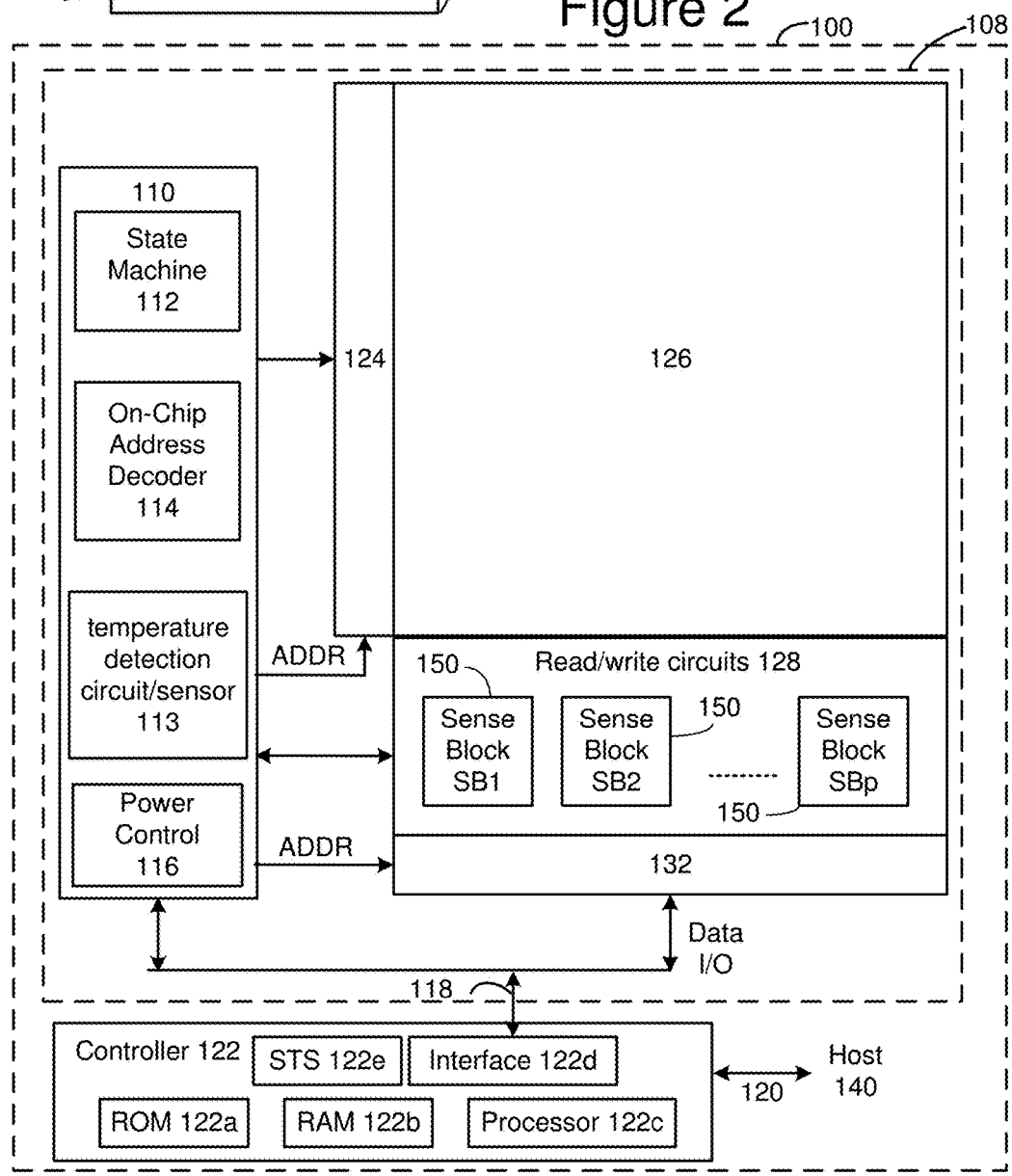
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, a power control module 116 and a temperature detection circuit 116. The state machine 112 provides die-level control of memory operations. Temperature detection circuit 113 (which is an example of a memory temperature sensor on memory die 108) is configured to detect temperature at the memory die 108, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and controller 122 can be considered a control circuit that performs the functions described herein.

The (on-chip or off-chip) controller 122 (which in one embodiment is an electrical circuit) may comprise one or more processors 122c, ROM 122a, RAM 122b, Memory Interface 122d and a system temperature sensor 122e, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
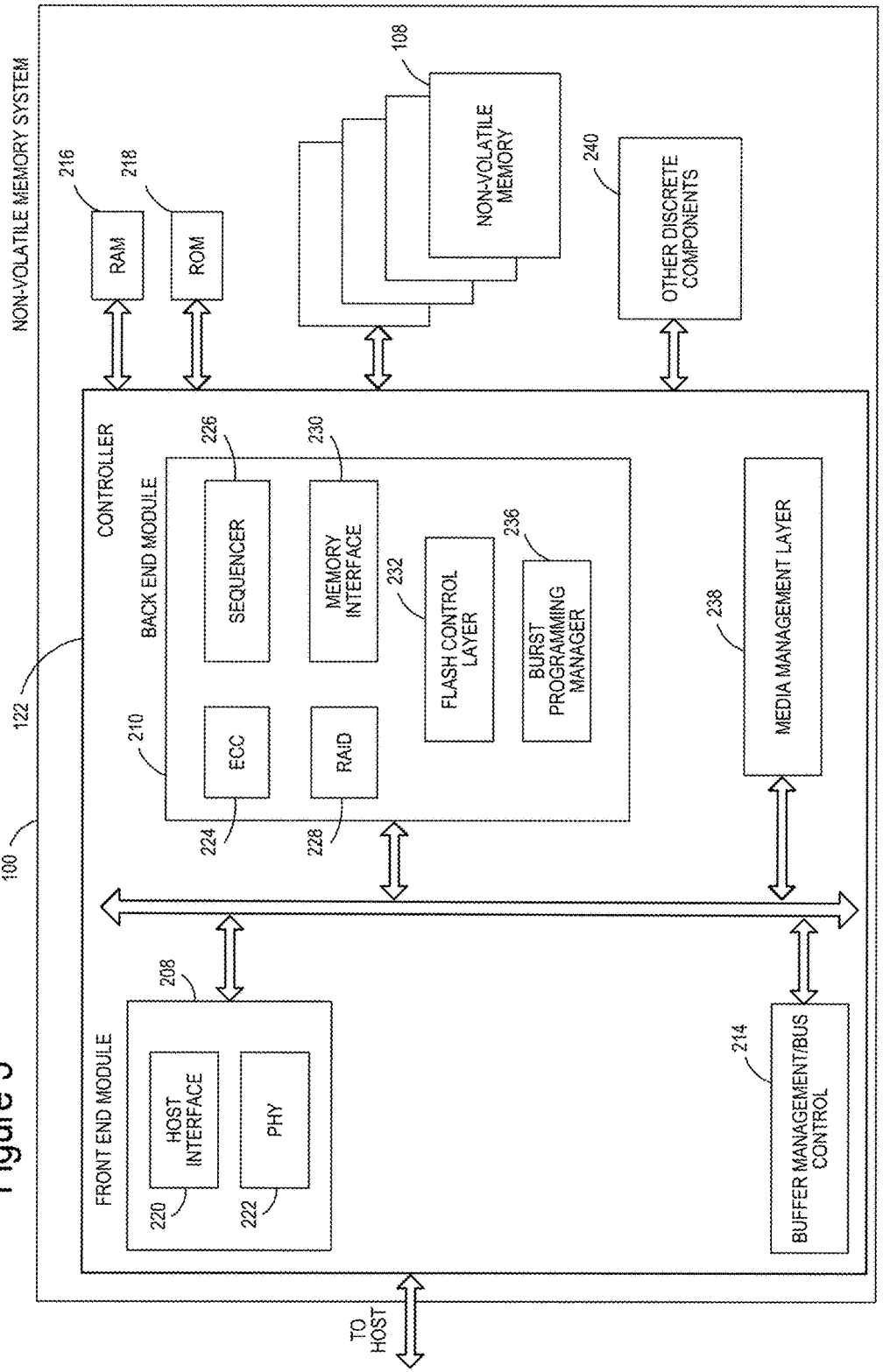
FIG. 3 is a block diagram depicting one embodiment of a memory system.

FIG. 3 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 112 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a burst programming manager 236, which manages burst programming. For example, in one embodiment, burst programming manager 236 may perform and/or manage the processes of FIGS. 8-11B described below. More details of burst programming are also provided below. Burst programming manager 236 can be an electrical circuit, a set of one or more software modules, or a combination of a circuit and software.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, laptop, tablet, etc. Additionally, the SSD need not be made to work as a hard drive.

Figure 3A:
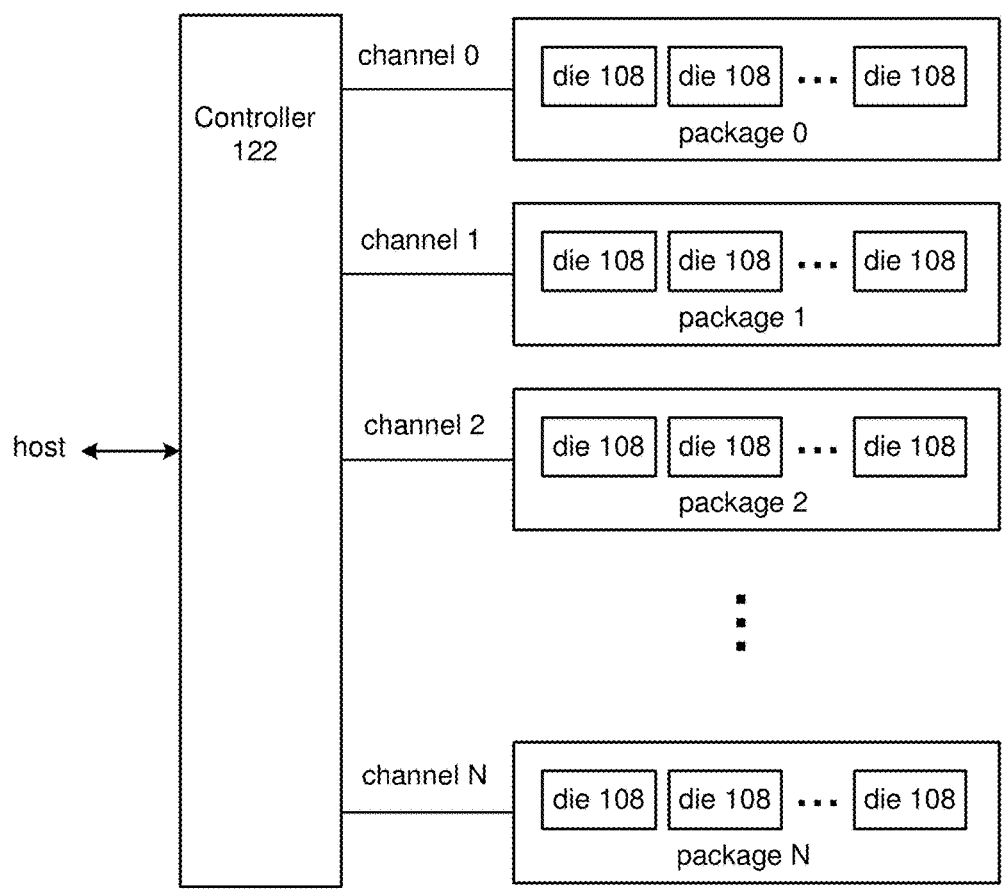
FIG. 3A is a block diagram depicting one embodiment of a memory system.
Figures 5, 6:
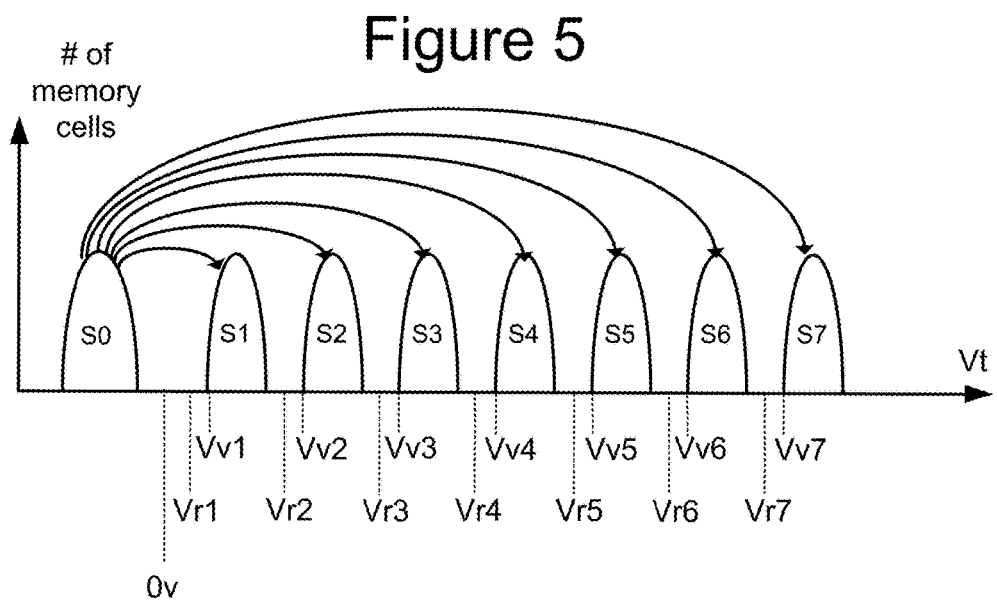
FIG. 5 depicts threshold voltage distributions.
FIG. 6 is a table describing one example of an assignment of data values to data states.

Some embodiments of a non-volatile storage system will include one memory die 108 connected to one controller 122. However, other embodiments may include multiple memory die 108 in communication with one or more controllers 122. In one example, depicted in FIG. 3A, the multiple memory die can be grouped into a set of memory packages. Each memory package includes one or more memory die in communication with controller 122. FIG. 6 shows N+1 memory packages (package 0-package N), and N+1 channels (channel 0-channel N) for communication between controller 122 and the memory dies 108 of respective memory packages 0-N. In one embodiment, a memory package includes a printed circuit board (or similar structure) with one or more memory die 108 mounted thereon. In some embodiments, a memory package can include molding material to encase the memory dies 108 of the memory package. In one embodiment, a memory package can be a single memory die 108. In some embodiments, controller 122 is physically separate from any of the memory packages.

Figure 4:
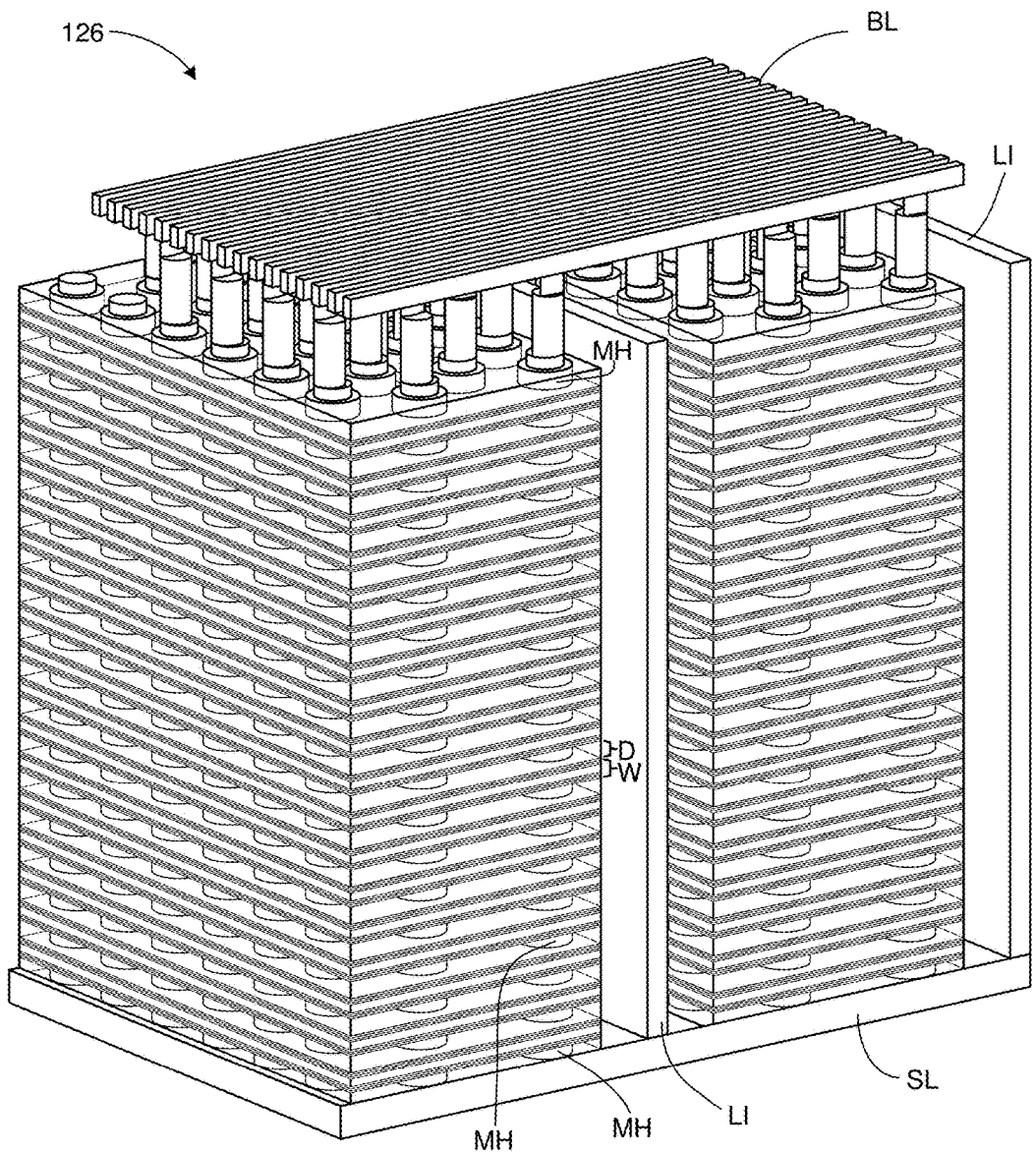
FIG. 4 is a perspective view of a portion of one embodiment of a monolithic three dimensional memory structure.

FIG. 4 is a perspective view of a portion of one example embodiment of a monolithic three dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4F.

Figure 4A:
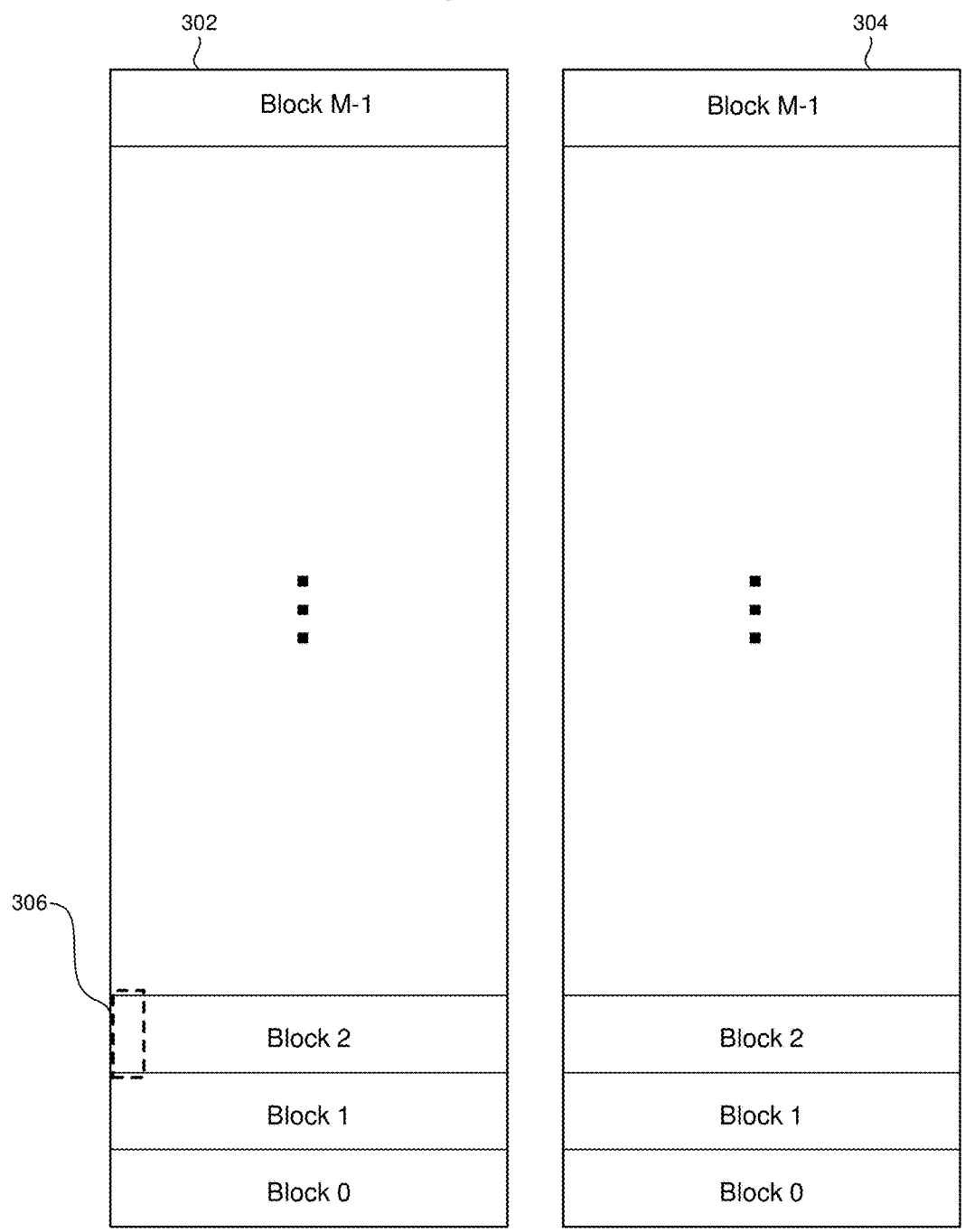
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
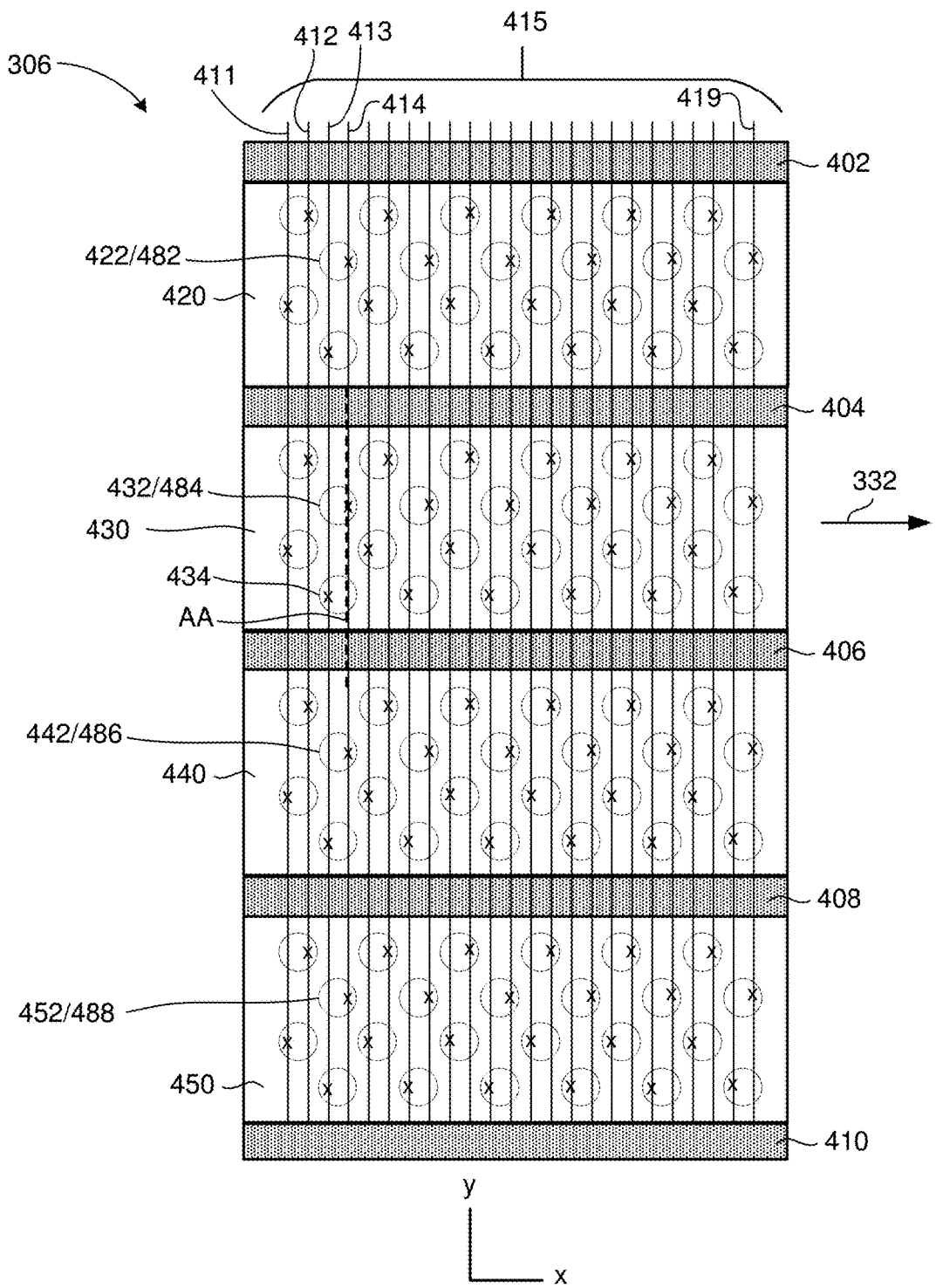
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
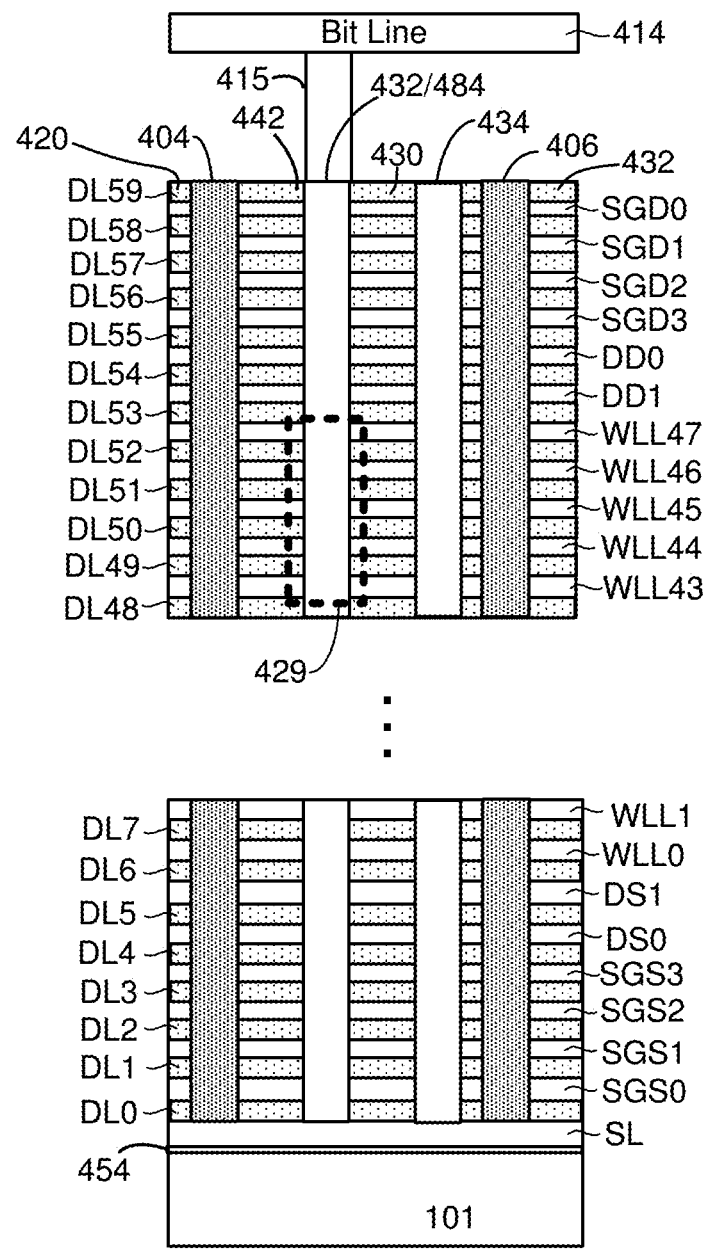
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
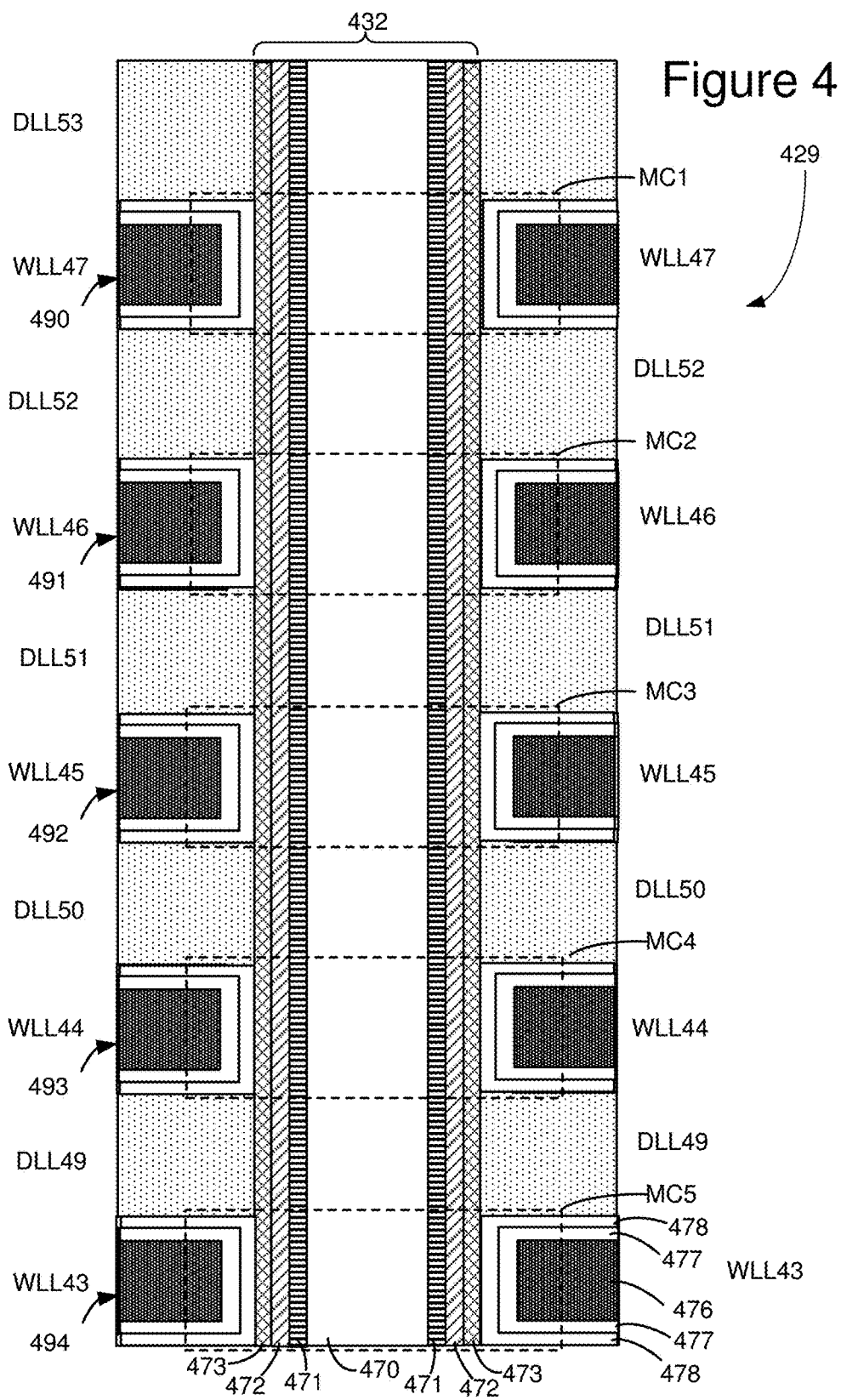
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
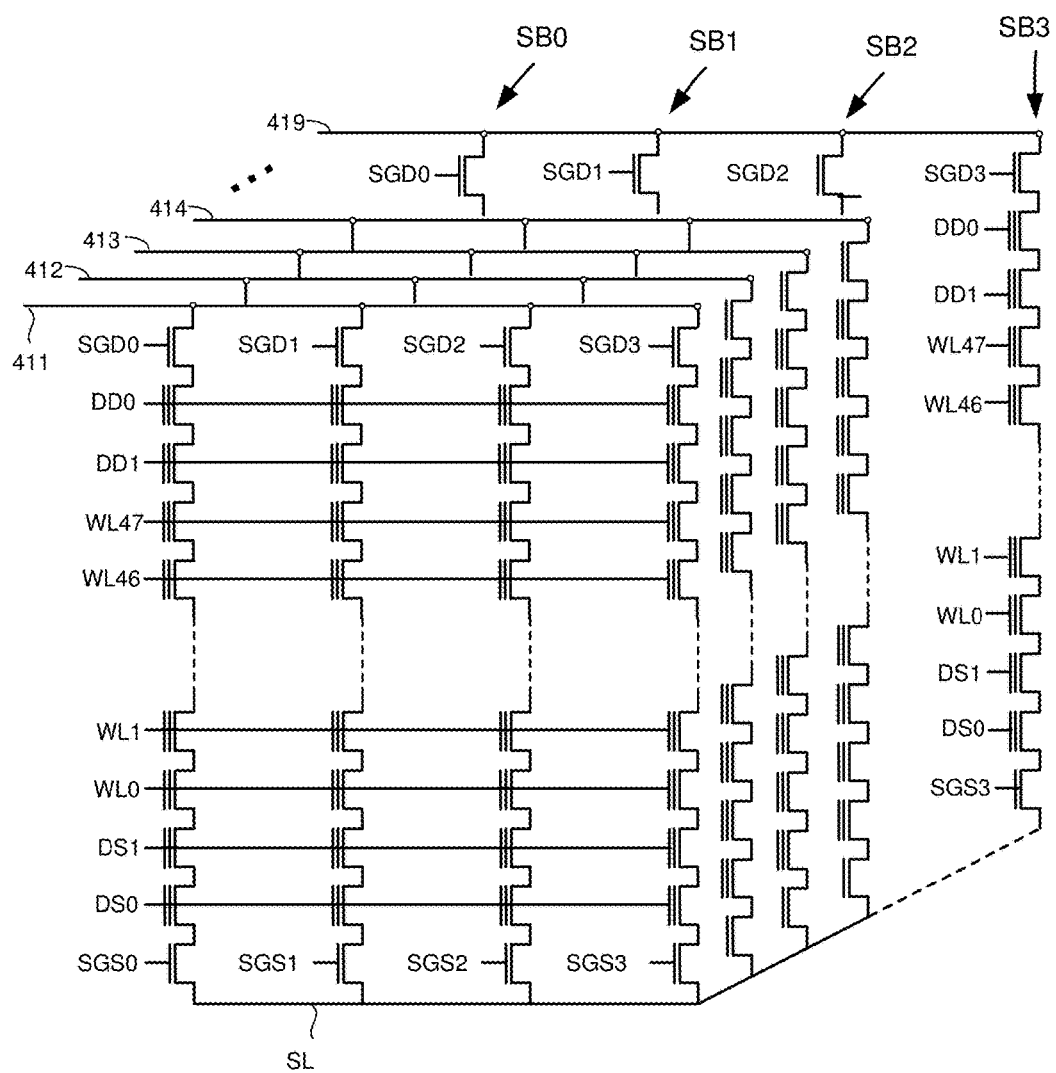
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side selection lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming) In some embodiments, data states S1-S7 can overlap, with controller 122 relying on ECC to identify the correct data being stored.

FIG. 6 is a table describing one example of an assignment of data values to data states. In the table of FIG. 6, S0—111. S1=110, S2=200, S3=000, S4=010, S5=011, S6=001 and S7=101. Other encodings of data can also be used. No particular data encoding is required by the technology disclosed herein.

In one embodiment, when a block is subjected to an erase operation, all memory cells are moved to data state S0, the erased state. In the embodiment of FIG. 6, all bits stored in a memory cell are 1 when the memory cells is erased (e.g., in data state S0).

Figure 7A:
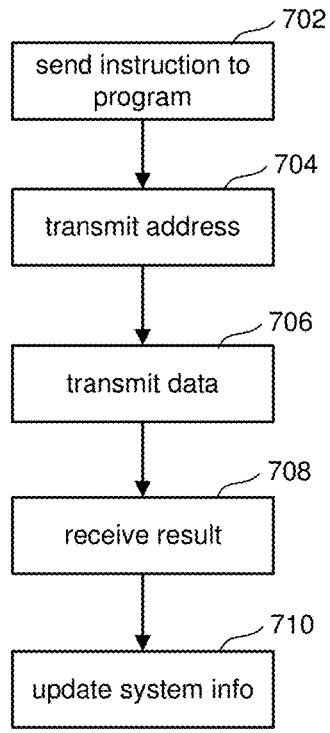
FIG. 7A is a flow chart describing one embodiment of a process for programming.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. controller can also scramble the data to achieve wear leveling with respect to the memory cells.

Figure 7B:
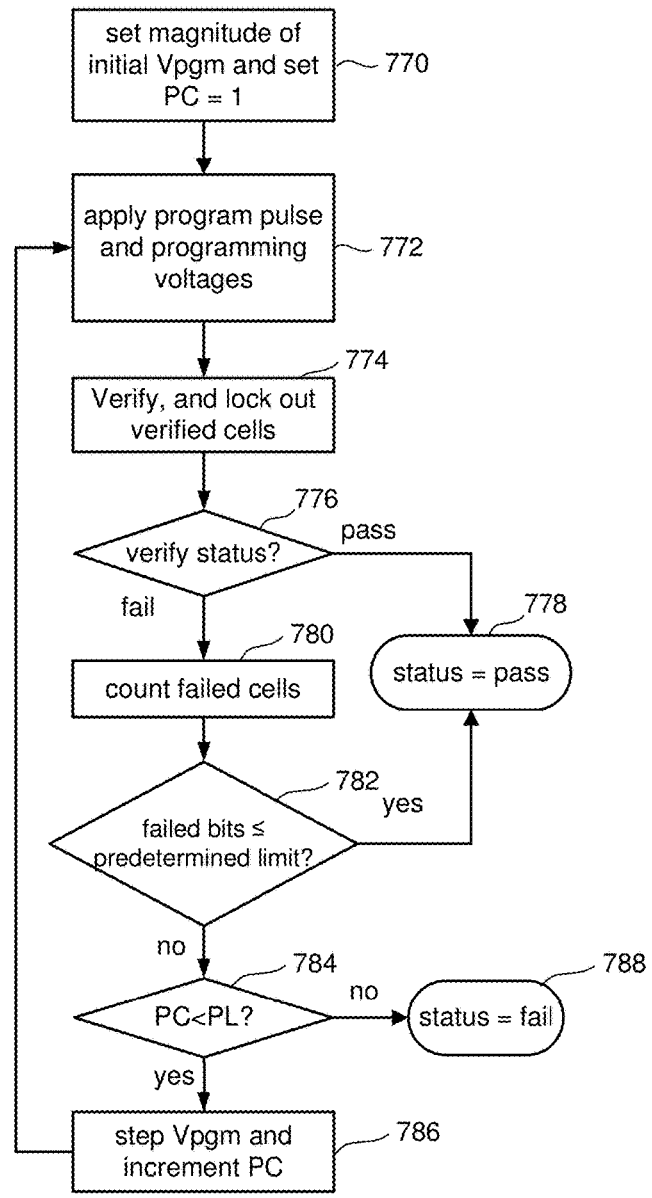
FIG. 7B is a flow chart describing one embodiment of a process for programming.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of FIG. 7B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 7B is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units.

For purposes of this document, a block is a physical grouping of memory cells. In one example, a block is a unit of erase. However, in other examples a block need not be a unit of erase. In one example, a block comprises a set of memory cells connected to connected by uninterrupted word lines such as a set of NAND strings connected to a common set of word lines. Other physical arrangement can also be used.

A jumbo block is a logical combination of blocks from multiple memory die. Therefore, a super block spans multiple memory die of a non-volatile memory system. Jumbo blocks are units of data that are programmed and read together, but span across multiple memory die 108. In one embodiment, a jumbo block includes one block (or more than one block) from each memory die of a set of memory dies. In one example implementation, a jumbo block includes one block from each plane of each memory die. In one example implementation, a jumbo block includes two blocks from one die in each package, where the two blocks from one die include one block from each of two planes. However, other arrangements can also be used.

FIG. 8 depicts an example of a jumbo block 800. As depicted, jumbo block 800 includes four physical blocks: block X from die 0, block X from die 1, block X from die 2 and block X from die 3. In other embodiments, jumbo block 800 can include two blocks from each die, one from each of two planes. Although FIG. 8 shows jumbo block 800 spanning four memory die, in other embodiments a jumbo block can span more than four die or less than four die. FIG. 8 only shows eight word lines in each block; however, it is likely that most blocks (or all blocks) have more than eight word lines (e.g., each block having 48 word lines for storing user/host data). In some embodiments, a jumbo block includes the same block address (e.g. X) from each memory die, while in other embodiments a jumbo bock can include different a block address for each block (or a subset of blocks); for example, block 1 of die 0, block 1003 of die 1, block 3033 of die 2, block 44 of die 3, etc.

Corresponding word lines of the individual physical blocks of a jumbo block are logically treated as one large word line. For example, word line WL0 of each block of jumbo block 800 is part of a jumbo word line WL0.

Sometimes a memory system receives the exact amount of data to fill one word line of one block. Other times, the memory system receives a set of data that requires programming memory cells connected to multiple word lines of a block or a jumbo block. Burst programming is the writing of a large amount of data in response to a programming command such that the data will occupy more than one word line in a set of one or more target physical blocks. This is in contrast to programming multiple word lines in response to multiple programming commands (e.g., one programming command per word line). Burst programming can include programming data to multiple word lines of a jumbo block. For example, FIG. 8A depicts jumbo block 800 after a burst programming process. Data "xxxxxxxxxx" has been written to three word lines (WL0, WL1 and WL2) of jumbo block 800. That is, each physical block of the jumbo block has data written to WL0, WL1, and WL2. In other embodiments, the data can be written to different word lines of the different physical blocks.

As noted above, when programming there is a possibility that the programming process fails—known as a program fault. If there is a program fault on a word line of a particular block, then there is a chance that there is a defect in that particular block so it is desirable to move data already programmed in the particular block to a new and safer block.

When performing burst programming, if there is a program fault on one of the word lines of one of the blocks, prior systems will pause the entire burst programming process so that the data of the program fault can be programmed somewhere else and all of the already programmed data in the block that experienced the program fault can be moved. This pausing of the entire burst programming for all physical blocks is not efficient.

FIG. 9 is a flow chart describing one embodiment of a process for efficiently recovering from a program fault; for example, if there is a program fault on one of the word lines of one of the blocks (or s subset of word lines of a subset of the blocks). The process of FIG. 9 can be performed by or at the direction of controller 122, including Burst Programming Manager 236. Alternatively, the process of FIG. 9 can be performed by or at the direction of state machine 112 (in conjunction with the other circuits on memory die 108) or by another control circuit on or off memory die 108 and/or on or off memory system 100. The process of FIG. 9 explicitly provides an example of recovering from a program fault during burst programming (e.g., a burst write process that programs data to memory cells on multiple word lines of each block of a set of blocks); however, the process of FIG. 9 can also be used during programming processes that are not burst programming In order to enable the process of FIG. 9, the control circuit (e.g., controller 122, state machine 112, and/or other circuit)) is configured to maintain an indication of back-up blocks prior to attempting to program data (for burst programming or other programming) That is, the control circuit has reserved a set of back-up blocks prior to step 902 of FIG. 9. These back-up blocks can be listed in a table.

In step 902 of FIG. 9, the control circuit performs burst programming in the nonvolatile memory. For example, jumbo block 800 of FIG. 8A will be programmed with the intent of filling three word lines (e.g., w0, w1, w2) with data. In step 904, the control circuit determines that a program fault occurred during the burst programming and prior to completing the burst programming Thus, at this point in time, there is still more data to be programmed. For example, if the burst programming includes programming five word lines, perhaps the program fault occurred while programming the third word line of five. In step 906, data associated with the program fault is programmed to a back-up location in the nonvolatile memory. For example, the data being programmed that failed the programming process will be reprogrammed to a back-up block. Thus, step 906 includes the control circuit choosing one of the back-up blocks that were previously identified. The data that failed programming will then be programmed to that chosen back-up block. In step 908, after programming the data associated with the program fault to the back-up location, the system will continue the burst programming including programming data that has not yet been subject of a programming process to the back-up location. That is the remaining portions of the burst programming are completed. As discussed in the example above, if the program fault occurred during programming data on the third of five word lines, then step 908 will include programming the data for the fourth word line and the fifth word line. The block in which the program fault occurred will not be used anymore. Rather, data intended for that faulty block is then programmed into the chosen back-up block as part of step 908. More detail will be discussed below with respect to FIGS. 10A-D. In step 910, after programming data that has not yet been subject of a programming process to the back-up location, the control circuit will move already programmed data in the nonvolatile memory to the back-up location. For example, data already programmed in other word lines of the faulty block will be moved to the back-up block.

Figure 10C:
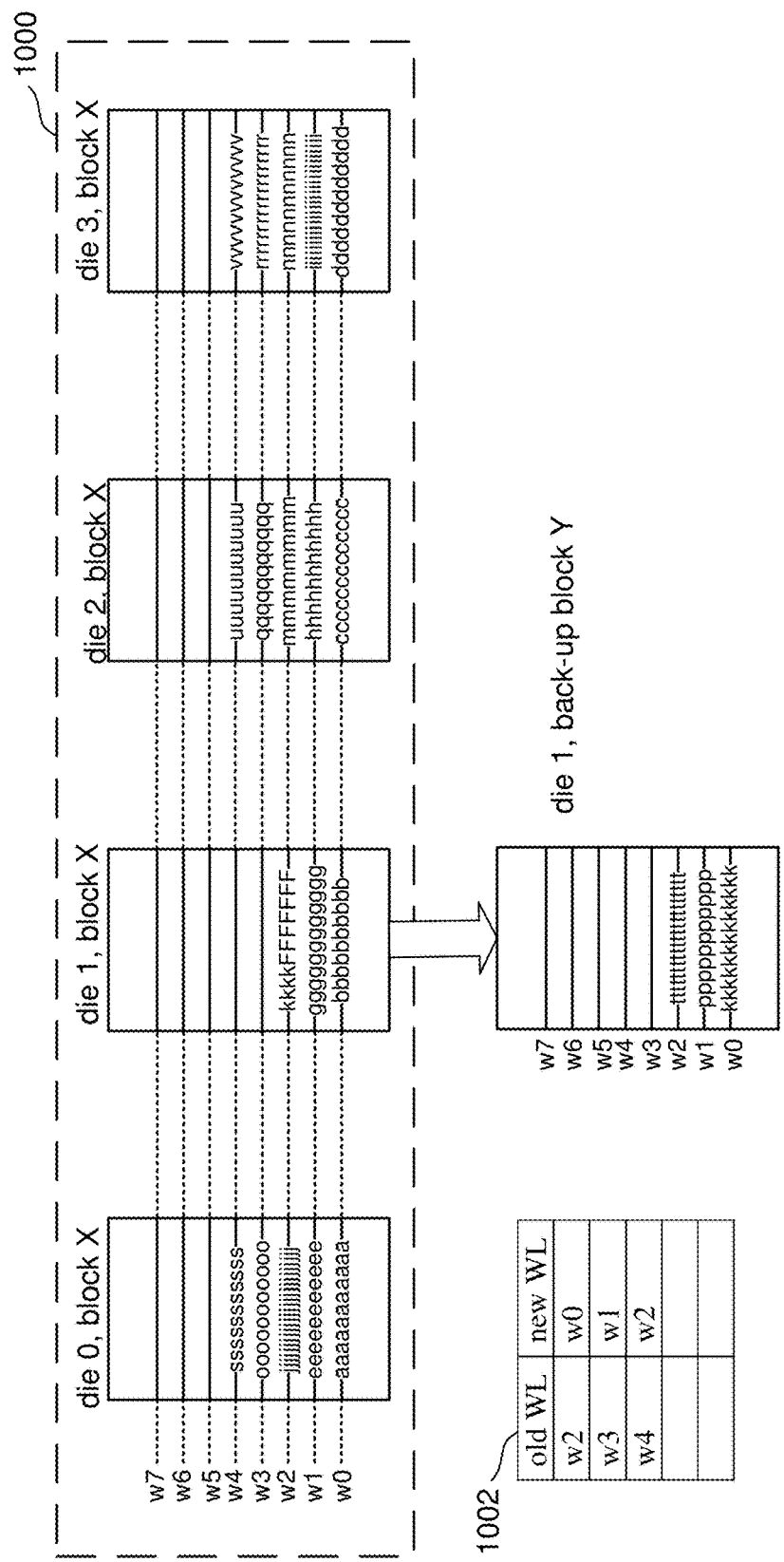

FIGS. 10A-D depict a jumbo block 1000 during an example implementation of the process of FIG. 9. FIG. 10A shows jumbo block 1000 including four dies. The jumbo block includes one physical block from each of die 0, die 1, die 2, and die 3. In other embodiments, jumbo block 1000 could include blocks from more or less than four dies. A jumbo block can also include more or less than four physical blocks. In some embodiments, a jumbo block can include a physical block from each plane (or multiple planes) of each die (or a subset of dies). FIG. 10A shows the state of jumbo block 1000 after steps 902 and 904 of FIG. 9. That is, the system has started burst programming for jumbo block 1000 (see step 902). However, a program fault occurred during the burst programming and prior to completing the burst programming (step 904). Thus, the burst programming is only partially completed. For example, die 0, block X has successfully programmed the data "aaaaaaaaaaa" to the memory cells connected to word line w0, "eeeeeeeeeee" to the memory cells connected to word line w1, and "jjjjjjjjjjjjjjjjjjjj" to the memory cells connected to word line w2. Similarly, die 1, block X has successfully programmed the data "bbbbbbbbbbb" to the memory cells connected to word line w0 and "ggggggggggg" to the memory cells connected to word line w1. However, word line w2 of die 1, block X was intended to store "kkkkkkkkkkkk" but there was a program fault that is represented in FIG. 10A by "FFFFFFF." Die 2, block X has successfully programmed the data "ccccccccccc" to the memory cells connected to word line w0, "hhhhhhhhhh" to the memory cells connected to word line w1, and "mmmmmmmm" to the memory cells connected to word line w2. Die 3, block X has successfully programmed the data "ddddddddddd" to the memory cells connected to word line w0, "iiiiiiiiiiiiiiiiiiiiiii" to the memory cells connected to word line w1 and "nnnnnnnnnn" to the memory cells connected to word line w2. Thus, FIG. 10A graphically shows that the control circuit of the memory system was configured to attempt to program data to first memory cells connected to a first word line of a first block (e.g., the memory cells connected to word line w2 of die 1, block X) and determine that the programming of the data to the first memory cells failed.

FIG. 10B shows jumbo block 1000 after step 906 of FIG. 9. That is the control circuit has identified a back-up block (die 1, back-up block Y) and has programmed the data associated with the program fault to the back-up block. Note that the back-up block (block Y) and the faulty block (die 1, block X) are in the same die. Thus, the original data intended to be programmed to word line w2 of block X of die 1 is now programmed to word line w0 of back-up block Y of die 1. FIG. 10B shows that the control circuit is configured to program the data associated with the program fault to second memory cells connected to a particular word line of the second block in response to determining that the programming of the data of the first memory cells failed. The particular word line of the second block used for programming the data associated with the program fault is the first word line of the second block (word line W0 of back-up block Y). By first word line, it is meant that the word line is the first word line to be programmed. It is also an edge word line in that of the group of word lines used to store host or user data word line W0 and word line W47 are at the edge of the group of word lines (i.e., at the beginning or end of the group of word lines), assuming 48 word lines for user/host data.

The control circuit has also set up a linking table 1002, which indicates a correlation between word lines of the first block (the faulty block) and word lines of the second block (the back-up block Y). Linking table 1002 includes two columns. The left column indicates an identification of the old word line from the faulty block. The right hand column indicates the word line of the new back-up block. The first row of linking table 1002 shows an old word line of w2 and a new word line of w0. That means, that the data that was supposed to be programmed to word line w2 in the faulty block is now programmed in word line w0 of the back-up block.

FIG. 10C shows jumbo block 1000 after step 908 of FIG. 9. That is, after programming data associated with the program fault to back-up block Y, the system continues the burst programming which includes programming data that has not yet been subject to programming process to the back-up block as well as the originally targeted blocks. For example, FIG. 10C shows that additional data was programmed to word lines w3 and w4 of block X of die 0, block X of die 2 and block X of die 3. The additional data for the burst program was also programmed to back-up block Y of die 1 at word lines w1 and w2. Step 908 also includes updating linking table 1002, which now indicates that the additional data from the burst programming that was targeted for word line w3 is now stored in word line w1 and data that was targeted for word line w4 is now in word line w2. Thus, FIG. 10C shows that the control circuit is configured to program additional data to third memory cells connected to additional word line of the second block (e.g., the memory cells connected to either word line w1 or word line w2 of back-up block Y).

Figure 10D:
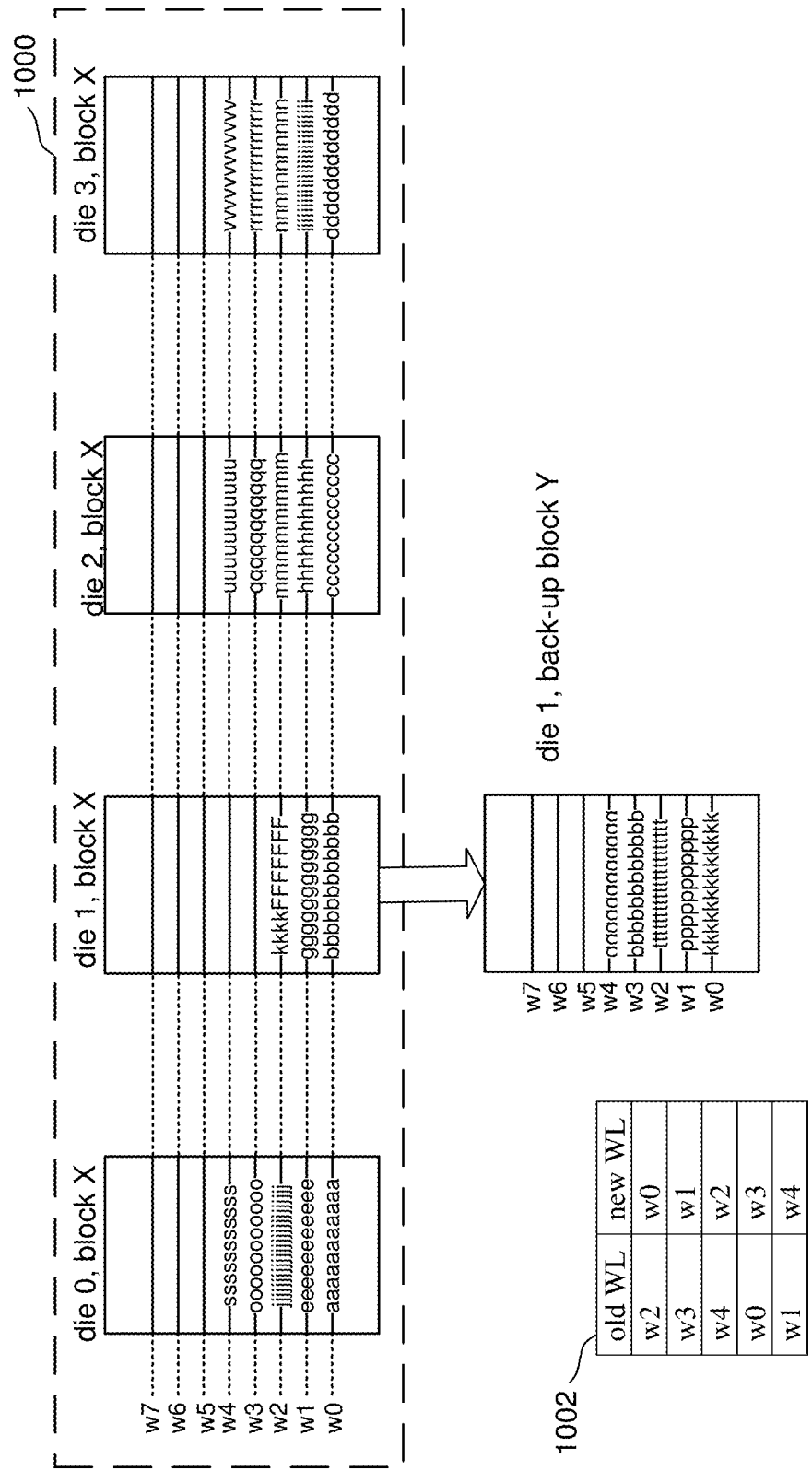

FIG. 10D depicts the state of jumbo block 1000 after step 910 of FIG. 9. That is, after programming data that has not yet been subjected of a programming process to the back-up location, the control circuit moves already programmed data to the back-up block. For example, already programmed data "ggggggggggg" and data "bbbbbbbbbbb" are moved from word lines w0 and w1 of die 1, block X to word lines w3 and w4 of back-up block Y of die 1. The linking table(s) are also updated to indicate that the data from w0 of the faulty block is now stored in the memory cells connected to word line w3 of the back-up block and data from w1 of the faulty block is now stored in memory cells connected to word line w4 of the back-up block. Thus, linking table 1002 indicates where old data from memory cells in the faulty block are stored in the back-up block. In the linking table, the order of word lines of the first block (the faulty block) can be different than the order of word lines in the second block (the back-up block).

Figure 11:
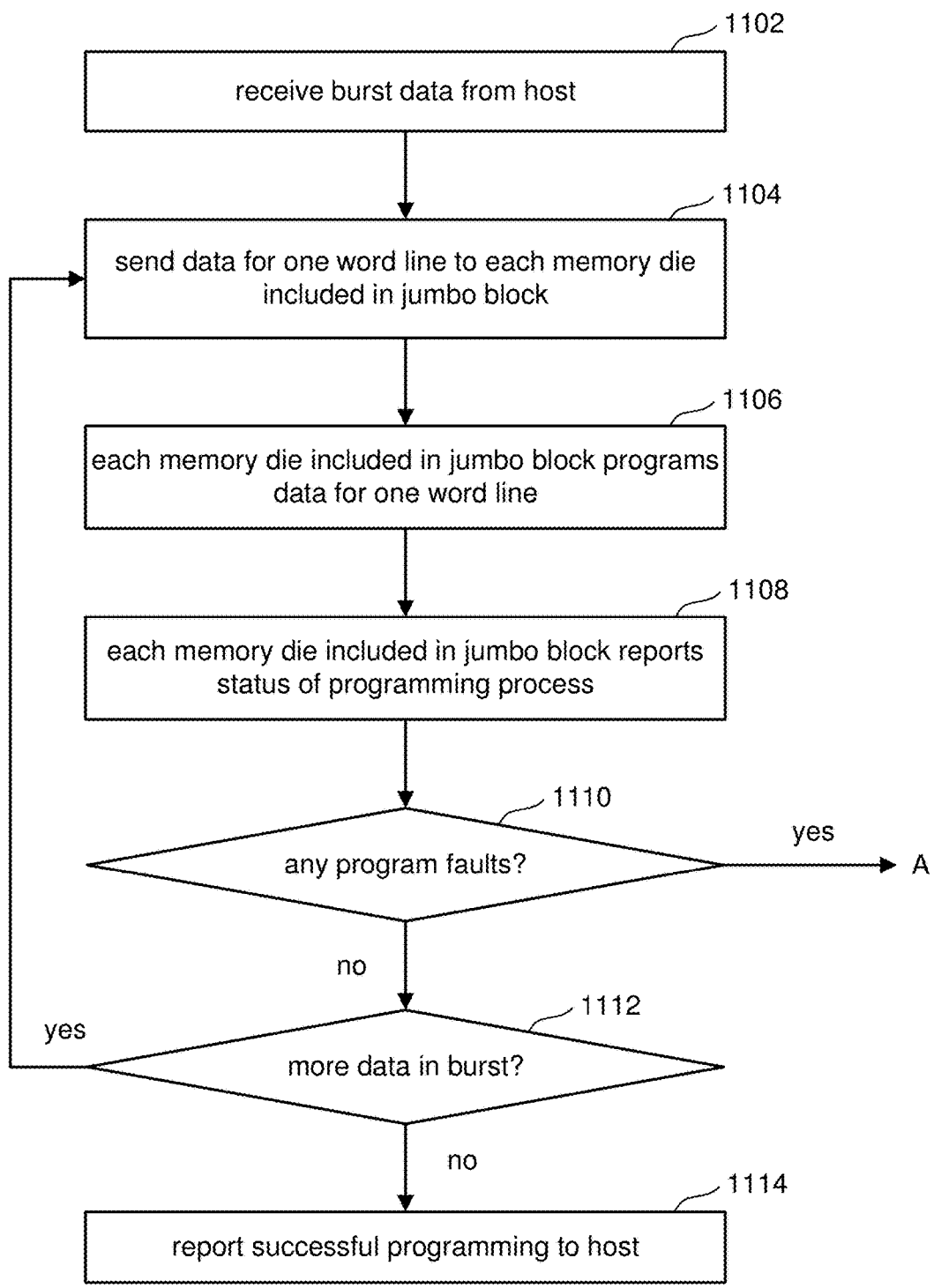
FIGS. 11, 11A and 11B together are a flow chart describing one embodiment of a process for efficiently recovering from a program failure.
Figure 11A:
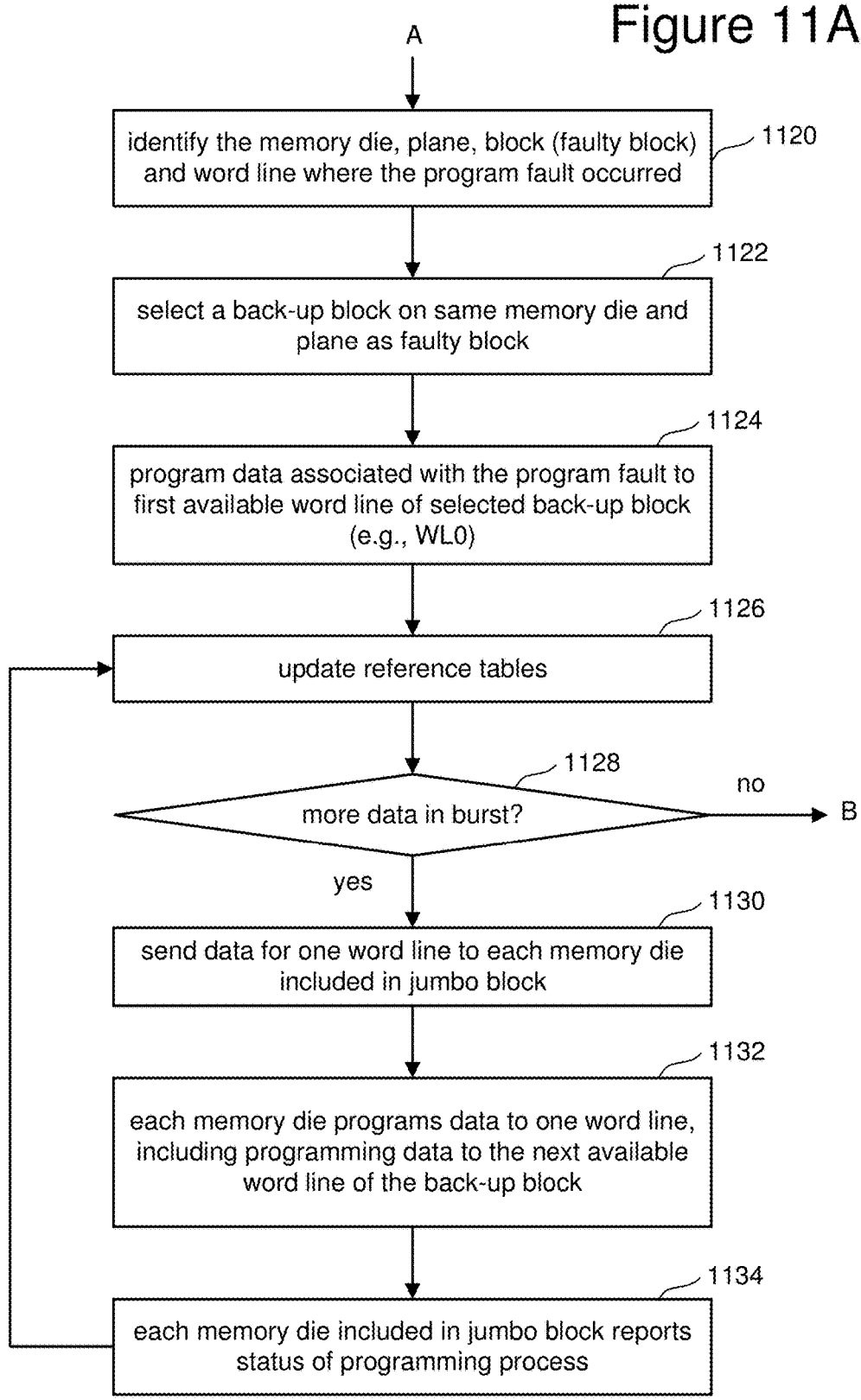
Figure 11B:
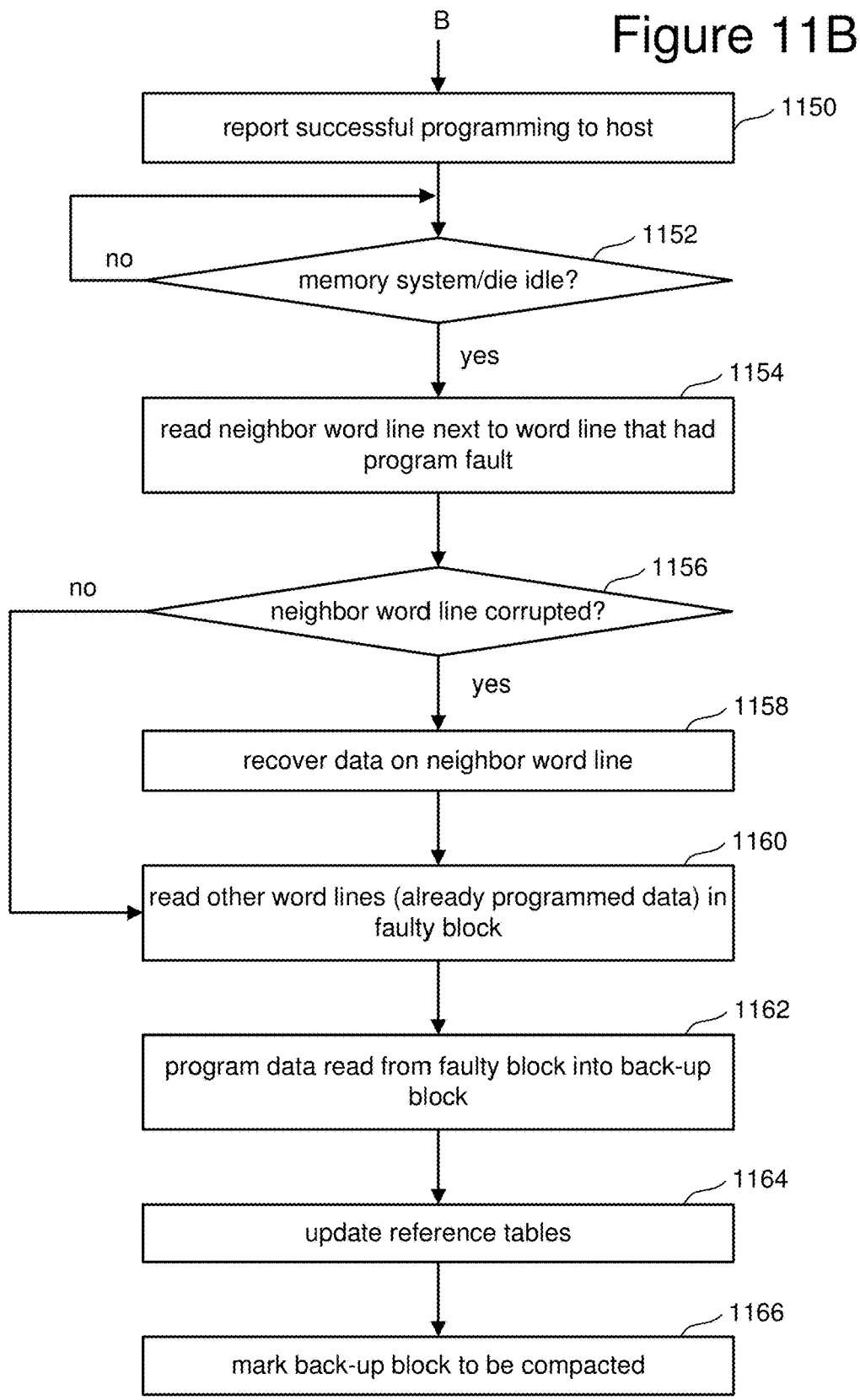

FIGS. 11, 11A and 11B together are a flow chart describing more details for one example implementation of the process of FIG. 9. As discussed above, the process can be applied to programming burst data or programming data that is not burst data. The process of FIGS. 11, 11A and 11B can be performed by or at the direction of controller 122, including burst programming manager 236. Alternatively, the process of FIGS. 11, 11A, and 11B can be performed by or at the direction of another control circuit on or off memory die 108 and/or on or off memory system 100. In step 1102, the memory system receives burst data from the host (or another entity such as a client, server, etc.). For example the data is received at controller 122. In step 1104, data for one word line (i.e., data to be stored in memory cells connected to a single word line) is transmitted from controller 122 to each of the memory die included in the jumbo block. In one embodiment, each of the different memory die receive a different set of data, where each set is enough data to be stored on all of the memory cells connected to the respective word line. In step 1106, each memory die included in the jumbo block programs the data received for the one targeted word line. In step 1108, each memory die included in the jumbo block reports the status of the respective programming process. Controller 122 determines (step 1110) if there are any program faults. This determination is based on the status reports received back from each of the memory die in step 1108. If there are no program faults, then in step 1112 controller 122 determines whether there is any more data in the burst that has not yet been programmed. If there is more data in the burst that has not yet been programmed, then the process loops back to step 1104 and then the next sets of data are provided to the memory die included in the jumbo block. If, in step 1112, controller 122 determines that there is no more data in the burst, then step 1114 controller 122 reports the successful programming to the host (or other entity).

If, in step 1110, controller 122 determines if there was a program fault then in step 1120 (see FIG. 11A) controller 122 identifies the memory die, plane, block (faulty block) and word line where the program fault occurred. In step 1122, controller 122 selects a back-up block on the same memory die and same plane as the faulty block. In step 1124, data associated with the program fault is programmed to the first available word line of the selected back-up block. In many cases, the first available word line will be the first word line (WL0 or w0) because in many embodiments the selected back-up block will be a completely erased block. In other embodiments, the back-up block can be a partially programmed block (also known as an open block). In step 1126, controller 122 update various reference tables. One example reference table is the linking table described above which will be updated to indicate that the data associated with the program fault is now stored on the back-up block (see, e.g., linking table 1002 of FIG. 10B). In one embodiment, controller 122 will also include other reference tables including a map of bad blocks to replacement blocks, a map of physical blocks to logical jumbo blocks, a map of obsolete data, a map of logical block addresses to physical block addresses, a list of blocks to be compacted, as well as other tables necessary to maintain the memory system.

In step 1128 of FIG. 11A, controller 122 determines whether there is more data in the burst that needs to be programmed. If so, then in step 1130 controller 122 sends additional sets of data for programming memory cells on a single word line of each of the blocks included in the jumbo block. That is, each memory die included in the jumbo block will receive enough data to program memory cells connected to one word line. In step 1132, each memory die programs the data for one word line, including programming data to the next available word line of the back-up block (e.g., see FIG. 10C). In step 1134, each memory die included in the jumbo block reports the status of the programming process. After step 1134, the process loops back to step 1126. Note that if there was an additional program fault, the process would continue at step 1120. The loop of steps 1126-1134 is continued until the burst programming process has completed. When there is no more data to be programmed for the burst programming process (see step 1128), then the process continues at step 1150 (see FIG. 11B), in which controller 122 reports a successful programming to the host.

In step 1152, controller 122 determines whether the memory system is idle. The memory system is idle if it is not performing a host command, such as programming, reading and/or erasing at the request of the host. For example, the memory system is idle after it finishes a programming process and is waiting for the next command from the host. Step 1152 could include testing whether the entire memory system (including multiple memory die) is idle. Alternatively, step 1152 can include testing whether a single memory die (the memory die that included the program fault) is idle. If the memory system (or memory die) is not idle, the process of FIG. 11B will continue to loop and wait for the system or memory die to become idle. When the memory system (or memory die) is determined to be idle, then in step 1154 controller 122 reads the data stored on the memory cells connected to the word line next to the word line that had the program fault. This word line is referred to as the neighbor word line. For example, looking back at FIG. 10B, word line w2 of block X in die 1 had the program fault. The neighbor word line is word line w1 of block X in die 1.

It is known in the art to store data by first performing error correction process to create a set of code words. The code words are then stored in the memory. When reading, the code words are read and then decoded using a decode process associated with the error correction scheme. If the data has been corrupted, the decode process would not complete successfully and the code words cannot be decoded to host data. For example, if a word line experienced a program fault because it is shorted to a neighbor word line, then when programming that faulty word line, the data stored on the neighbor word line could be corrupted. In step 1156, controller 122 determines whether the data stored in the memory cells connected to the neighbor word line is corrupted. If not, then in step 1160, controller 122 reads the data from all the other word lines in the faulty block that already had data programmed. For example, looking at FIG. 10D, the other word lines that would be read in step 1160 are w0 and w1 of block X in die 1. In step 1162, the data read from those other word lines (including the neighbor word line) is programmed into the back-up block (as depicted in FIG. 10D). In one embodiment, the data read from the other word lines in step 1160 is moved (programmed into the back-up block) even if that data is corrupted. That is, even there is an ECC decoding error that exists in the data, the data with uncorrectable errors will still be moved to the back-up block. In one embodiment, the system does not decode the data when reading in step 1160, rather it just senses the information and reprograms the sensed information in step 1162. In other embodiments, the system will attempt to decode and if it decoded successfully then the data will be re-encoded and programmed in step 1162. However, if the decode fails, the data with errors is moved (reprogrammed) as initially sensed. In step 1164, the reference tables are updated, as discussed above. In step 1166, the back-up block is marked to be compacted. In one embodiment, controller 122 will include a table of blocks that are to be compacted when the system is idle. The process of compacting includes reading data, removing any errors, discarding stale or obsolete data and combining data to utilize less space in the memory structure.

Looking back at step 1156, if the neighbor word line is corrupted, then controller 122 recovers the data on the neighbor word line in step 1158. In one embodiment, the data on the neighbor word line is recovered from an XOR sum of data from multiple word lines of the faulty block. It is known in the art that memory systems will keep XOR sums of data programmed in a block. As a block is being programmed the controller will maintain an XOR sum. In some embodiments, until the block is completely programmed, that XOR sum is stored in a RAM on controller 122. Once a block has been completely filled with data, then a final XOR sum is created and stored on the last word line of the physical block itself. The XOR sum includes the combining of data from all the word lines programmed Thus, if any one word line gets corrupted, that word line data can be recovered from the XOR sum and the data on the other word lines. This recovery process is performed in step 1158. In other embodiments, other types of recovery processes can also be used. After step 1158, the process continues at step 1160.

Steps 1126 and 1164 including updating reference tables. FIG. 12 is a block diagram describing one example of a proposed reference table. The table of FIG. 12 can also be referred to as another example of a linking table. The table of FIG. 12 includes six columns. The first column (left most column) provides an identification of a jumbo block. The second column provides an indication of a faulty block within that identified jumbo block. The third column indicates the word line that is the faulty word line. The fourth column indicates the back-up block used by controller 122 to recover from the fault and where the data was moved. The fifth column indicates the first word line in the back-up block that was used to store the data associated with the fault. The sixth column indicates the word line that stores the start of the old data. The old data is the data that was previously programmed into the faulty block prior to the program fault. For example, the old data is the data stored in block X of die 1 on word lines w0 and w1 (see FIG. 10D).

One embodiment includes a method of operating a non-volatile storage system, comprising: performing burst programming in a non-volatile memory; determining that a program fault occurred during the burst programming and prior to completing the burst programming; programming data associated with the program fault to a back-up location in the non-volatile memory; after programming data associated with the program fault to the back-up location, continuing the burst programming including programming data that has not yet been subject of a programming process to the back-up location; and after programming data that has not yet been subject of a programming process to the back-up location, moving already programmed data in the non-volatile memory to the back-up location.

One embodiment includes a non-volatile memory apparatus, comprising: a plurality of memory cells arranged in blocks; a plurality of word lines connected to the memory cells; and a control circuit in communication with the plurality of memory cells and the plurality of word lines. The control circuit is configured to attempt to program data to first memory cells connected to a first word line of a first block and determine that the programming of the data to the first memory cells failed. The control circuit is configured to program the data to second memory cells connected to a particular word line of a second block in response to determining that the programming of the data to the first memory cells failed. The control circuit is configured to program additional data to third memory cells connected to an additional word line of the second block. The control circuit is configured to move old data from memory cells in the first block to memory cells in the second block after the programming additional data to the third memory cells.

One embodiment includes as apparatus, comprising: a memory interface adapted to connect to non-volatile memory apparatus having multiple memory die; and means for programming data via the memory interface across multiple word lines of each block of multiple blocks on multiple memory die such that in response to a program fault in a faulty block the programming of data continues using a back-up block for the faulty block to program data that was unsuccessfully programmed due to the program fault and to program additional data. Already programmed data in the faulty block is moved to the back-up block after the additional data is programmed to the faulty block.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method of operating a non-volatile storage system, comprising:
   performing burst programming for a non-volatile memory;
   determining that a program fault occurred during the burst programming and prior to completing the burst programming;
   programming data associated with the program fault to a back-up location in the non-volatile memory;
   after programming data associated with the program fault to the back-up location, continuing the burst programming including programming data that has not yet been subject of a programming process to the back-up location; and
   after programming data that has not yet been subject of a programming process to the back-up location, moving already programmed data in the non-volatile memory to the back-up location.

2. The method of claim 1, wherein:
   determining that the system is idle, the moving the already programmed data in the non-volatile memory to the back-up location is performed when the system is idle in response to determining that the system is idle.

3. The method of claim 1, wherein:
the non-volatile memory system includes multiple memory die;
the performing burst programming comprises programming data to multiple word lines of each block of a set of target blocks on different memory die;
the determining that the program fault occurred comprises identifying a faulty memory die, faulty block and faulty word line for the program fault; and
the back-up location is a back-up block on the same faulty memory die as the faulty block.

4. The method of claim 1, wherein:
the performing burst programming comprises performing full sequence programming for a jumbo block.

5. The method of claim 1, wherein the moving already programmed data in the non-volatile memory to the back-up location comprises:
sensing the already programmed data, the already programmed data includes errors; and
re-programming the sensed already programmed data with the errors to the back-up location.

6. A non-volatile memory apparatus, comprising:
a plurality of memory cells arranged in blocks;
a plurality of word lines connected to the memory cells; and
a control circuit in communication with the plurality of memory cells and the plurality of word lines, the control circuit is configured to attempt to program data to first memory cells connected to a first word line of a first block and determine that the programming of the data to the first memory cells failed, the control circuit is configured to program the data to second memory cells connected to a particular word line of a second block in response to determining that the programming of the data to the first memory cells failed, the control circuit is configured to program additional data not yet programmed to third memory cells connected to an additional word line of the second block, the control circuit is configured to move old data that is already programmed from memory cells in the first block to memory cells in the second block after the programming additional data to the third memory cells.

7. The non-volatile memory apparatus of claim 6, wherein:
the control circuit is configured to attempt to program data to first memory cells connected to the first word line of the first block as part of a burst write process that programs data to memory cells on multiple word lines of each block of a set of blocks; and
the control circuit is configured to complete the burst write process prior to moving old data from memory cells in the first block to memory cells in the second block.

8. The non-volatile memory apparatus of claim 6, wherein:
the control circuit is configured to attempt to program data to first memory cells connected to the first word line of the first block as part of a burst write process that programs data to a set of blocks that form a jumbo block; and
the burst write process is successful for multiple blocks of the jumbo block and failed for the first block.

9. The non-volatile memory apparatus of claim 6, wherein:
the control circuit is configured to maintain a linking table which indicates correlation between word lines of the first block and word lines of the second block, in the linking table the order of word lines of the first block are different than the order of word lines of the second block.

10. The non-volatile memory apparatus of claim 6, wherein:
the control circuit is configured to maintain a linking table which indicates correlation between word lines of the first block and word lines of the second block, the linking table indicates where old data from memory cells in the first block are stored in the second block.

11. The non-volatile memory apparatus of claim 6, wherein:
the control circuit is configured to maintain an indication of back-up blocks prior to attempting to program data to first memory cells connected to the first word line of the first block, the second block is one of the back-up blocks.

12. The non-volatile memory apparatus of claim 6, wherein:
the control circuit is configured to determine whether the non-volatile memory apparatus is idle; and
the control circuit is configured to move the old data to the second block in response to determining that the memory die is idle.

13. The non-volatile memory apparatus of claim 6, wherein:
the first block is on a memory die;
the control circuit is configured to determine whether the memory die is idle; and
the control circuit is configured to move the old data to the second block in response to determining that the memory die is idle.

14. The non-volatile memory apparatus of claim 6, wherein:
the control circuit is configured to move old data from memory cells in the first block to memory cells in the second block by determining whether neighbor data in memory cells connected to a neighbor word line is corrupted and recovering the neighbor data from an XOR sum of data from multiple word lines of the first block if the neighbor data is corrupted.

15. The non-volatile memory apparatus of claim 6, wherein:
the control circuit is configured to move old data from memory cells in the first block to memory cells in the second block by reading old data from the first block and programming the old data to the second block even if an ECC decoding error exists for the old data.

16. The non-volatile memory apparatus of claim 6, wherein:
the plurality of memory cells are arranged on multiple dies;
the control circuit is configured to attempt to program data to first memory cells connected to the first word line of the first block as part of a burst write process that programs data to memory cells on multiple word lines of each die of the multiple dies; and
the first block and the second block are on a common die.

17. The non-volatile memory apparatus of claim 6, wherein:
the plurality of memory cells are arranged in a three dimensional monolithic memory array.

18. A non-volatile memory apparatus, comprising:
a plurality of memory cells arranged in blocks;

a plurality of word lines connected to the memory cells; and a control circuit in communication with the plurality of memory cells and the plurality of word lines, the control circuit is configured to attempt to program data to first memory cells connected to a first word line of a first block and determine that the programming of the data to the first memory cells failed, the control circuit is configured to program the data to second memory cells connected to a particular word line of a second block in response to determining that the programming of the data to the first memory cells failed, the control circuit is configured to program additional data to third memory cells connected to an additional word line of the second block, the control circuit is configured to move old data from memory cells in the first block to memory cells in the second block after the programming additional data to the third memory cells, the particular word line of the second block is the first word line of the second block to be programmed and is an edge word line, the first word line of the first block is not an edge word line, the control circuit is configured to move old data stored on an edge word line of the first block to a word line of the second block that is not an edge word line.

19. An apparatus, comprising:

a memory interface adapted to connect to multiple memory die; and means for programming data via the memory interface across multiple word lines of each block of multiple blocks on multiple memory die such that in response to a program fault in a faulty block the programming of data continues using a back-up block for the faulty block to program data that was unsuccessfully programmed due to the program fault and to program additional data, and already programmed data in the faulty block is moved to the back-up block after the additional data is programmed to the back-up block.

20. The apparatus of claim 19, wherein:

the means for programming determines that the apparatus is idle and moves the already programmed data in the faulty block to the back-up block when the apparatus is idle.

\* \* \* \* \*